United States Patent
Yoo et al.

(10) Patent No.: US 7,397,829 B2
(45) Date of Patent: Jul. 8, 2008

(54) VERTICAL EXTERNAL CAVITY SURFACE EMITTING LASER

(75) Inventors: Jae-ryung Yoo, Suwon-si (KR); Gi-bum Kim, Yongin-si (KR); Jun-ho Lee, Seongnam-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 11/500,919

(22) Filed: Aug. 9, 2006

(65) Prior Publication Data

US 2007/0165690 A1      Jul. 19, 2007

(30) Foreign Application Priority Data

Jan. 17, 2006   (KR) ...................... 10-2006-0004860

(51) Int. Cl.
*H01S 3/10* (2006.01)
(52) U.S. Cl. .............................. 372/22; 372/21; 372/99; 372/101
(58) Field of Classification Search ................... 372/21, 372/22, 99, 101
See application file for complete search history.

(56) References Cited

U.S. PATENT DOCUMENTS

| | | | |
|---|---|---|---|
| 5,355,246 A * | 10/1994 | Tanuma | 359/326 |
| 6,996,140 B2 * | 2/2006 | Waarts et al. | 372/21 |
| 2006/0233206 A1 * | 10/2006 | Miner et al. | 372/22 |
| 2006/0280220 A1 * | 12/2006 | Yoo | 372/99 |

* cited by examiner

*Primary Examiner*—Dung T Nguyen
(74) *Attorney, Agent, or Firm*—Buchanan Ingersoll & Rooney PC (57) ABSTRACT

Provided is a VECSEL capable of achieving an excellent efficiency of a SHG crystal and being manufactured in a compact size. The VECSEL includes a laser chip, an external mirror, an SHG crystal, a lens element, and a wavelength selective mirror. The laser chip generates a first wavelength light, and the external mirror is spaced from the laser chip to face the front side of the laser chip. The SHG crystal is located between the external mirror and the laser chip to double the frequency of the first wavelength light to make a second wavelength light. The lens element is located between the SHG crystal and the laser chip to allow the first wavelength light generated from the laser chip to converge at the SHG crystal, and the wavelength selective mirror is located between the SHG crystal and the lens element to transmit the first wavelength light and reflect the second wavelength light to the external mirror.

15 Claims, 5 Drawing Sheets

PUMP BEAM

FIG. 8

PUMP BEAM

VERTICAL EXTERNAL CAVITY SURFACE EMITTING LASER

CROSS-REFERENCE TO RELATED PATENT APPLICATION

Priority is claimed to Korean Patent Application No. 10-2006-004860, filed on Jan. 17, 2006, in the Korean Intellectual Property Office, the disclosure of which is incorporated herein in its entirety by reference.

BACKGROUND OF THE DISCLOSURE

1. Field of the Disclosure

The present disclosure relates to a vertical external cavity surface emitting laser (VECSEL), and more particularly, to a VECSEL of a linear structure, certain embodiments of which being capable of achieving an excellent efficiency of a second harmonic generation (SHG) crystal and being manufactured to have a compact size.

2. Description of the Related Art

A VECSEL is a laser device providing a high output typically exceeding several to several tens of watts by replacing an upper mirror of a vertical cavity surface emitting laser (VCSEL) with an external mirror in order to increase a gain region.

Figure 1:
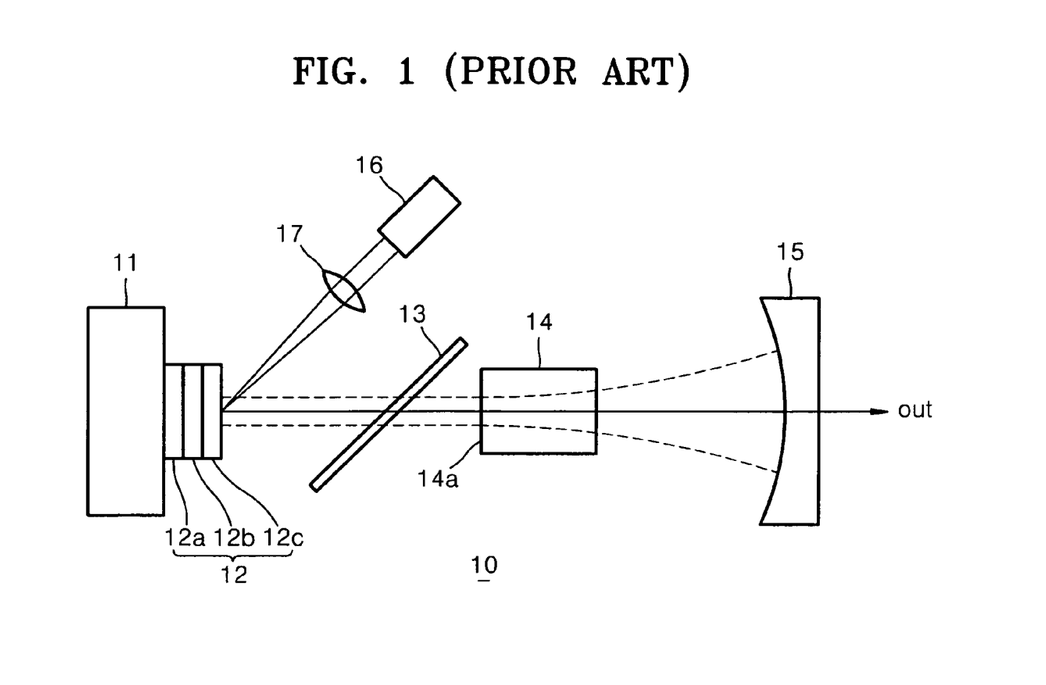
FIGS. 1 and 2 are schematic sectional views of a prior VECSEL having a linear structure.

FIG. 1 is a schematic sectional view of a prior art VECSEL having a linear structure. Referring to FIG. 1, the VECSEL 10 includes a laser chip 12 for laser oscillation attached on a heat spreader 11, an external mirror 15 spaced a predetermined distance from the laser chip 12, and a pump laser 16 obliquely disposed with respect to the laser chip 12 to provide a light for pumping to the laser chip 12. The laser chip 12 has a structure in which a distributed Bragg reflector (DBR) layer 12b and an active layer 12c are sequentially stacked on a substrate 12a. The active layer 12c has a multiple quantum well structure and is excited by a light for pumping to emit a light having a predetermined wavelength. The pump laser 16 allows a light of a wavelength shorter than that of a light that will be emitted from the laser chip 12, to be incident to the laser chip 12 through a lens 17 to excite the active layer 12c within the laser chip 12.

Also, a birefringent filter 13 passing only a light of a predetermined wavelength, and an SHG crystal 14 doubling the frequency of a light may be further located between the laser chip 12 and the external mirror 15. When the SHG crystal 14 is used, it is possible to convert an infrared light emitted from the laser chip 12 into a laser beam having a wavelength in a visible region.

With this structure, when a light beam emitted from the pump laser 16 is incident to the laser chip 12 through the lens 17, the active layer 12c within the laser chip 12 is excited to emit a light of a predetermined wavelength. The light emitted from the laser clip 12 resonates between the DBR layer 12b within the laser chip 12 and the external mirror 15. Then, the light whose frequency has been doubled by the SHG crystal 14 is outputted to the outside through the external mirror 15. To reduce light-loss, a coating layer may be formed on the surface 14a of the SHG crystal 14 that faces the laser chip 12 to have high reflectance with respect to a visible light and have high transmittance with respect to an infrared light.

The wavelength conversion efficiency of the SHG crystal 14 is generally proportional to the energy density of an incident light. Therefore, the beam diameter of a light incident to the SHG crystal 14 may be small, as small as possible. However, as illustrated in FIG. 1, since the prior VECSEL includes the SHG crystal 14 located far away from the laser chip 12, the beam diameter of an incident light is relatively large, which reduces the wavelength conversion efficiency of the SHG crystal 14.

Figure 2:
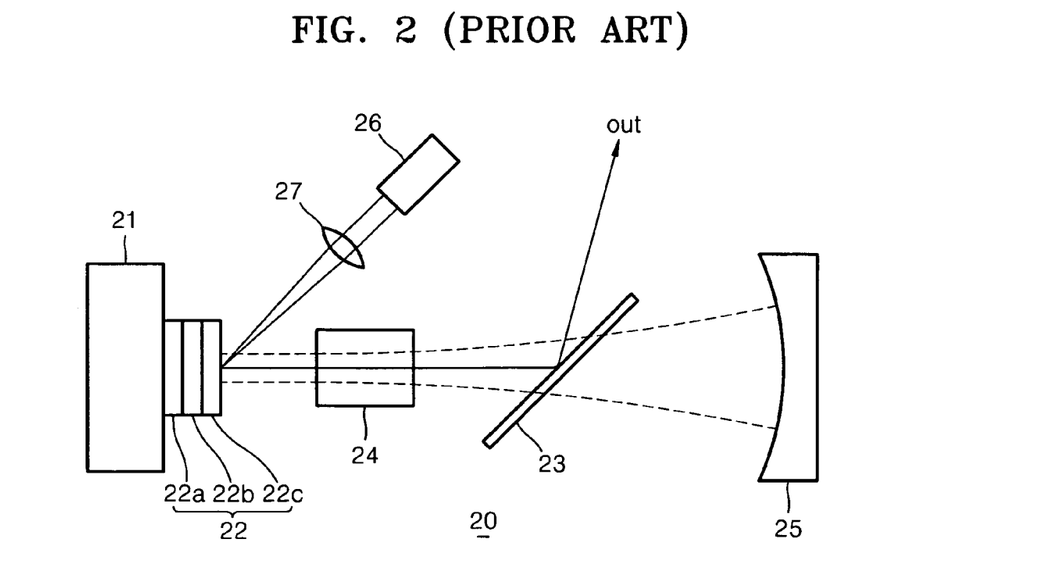

To solve this problem, another prior VECSEL 20 illustrated in FIG. 2 includes an SHG crystal 24 located between a laser chip 22 and a birefringent filter 23. In FIG. 2, other elements, i.e., a heat spreader 21, the laser chip 22, an external mirror 25, a pump laser 26, and a lens 27 are the same as those described with reference to FIG. 1. With this structure, a light generated from the laser chip 22 resonates between a DBR layer 22b and the external mirror 25, and a light whose frequency has been doubled by the SHG crystal 24 is reflected and outputted to the outside by a birefringent filter 23. For that purpose, a coating layer is formed on the surface of the birefringent filter 23 to have high reflectance with respect to the light whose frequency has been doubled. According to the prior VECSEL in FIG. 2, since the SHG crystal 24 is located closer to the laser chip 22, the wavelength conversion efficiency of the SHG crystal 24 is enhanced even more.

However, even in this case, since the beam diameter of a light incident to the laser chip 22 should be equal to the size of the oscillation region of the laser chip 22, it is difficult to minimize the beam diameter of a light incident to the SHG crystal 24. Also, there is a problem that the light whose frequency has been doubled is outputted to the lateral side of the VECSEL 20 obliquely with respect to the VECSEL 20. Furthermore, parts of light having predetermined polarization directions and whose frequencies have not been doubled may be reflected and outputted to the outside by the birefringent filter 23.

Figure 3:
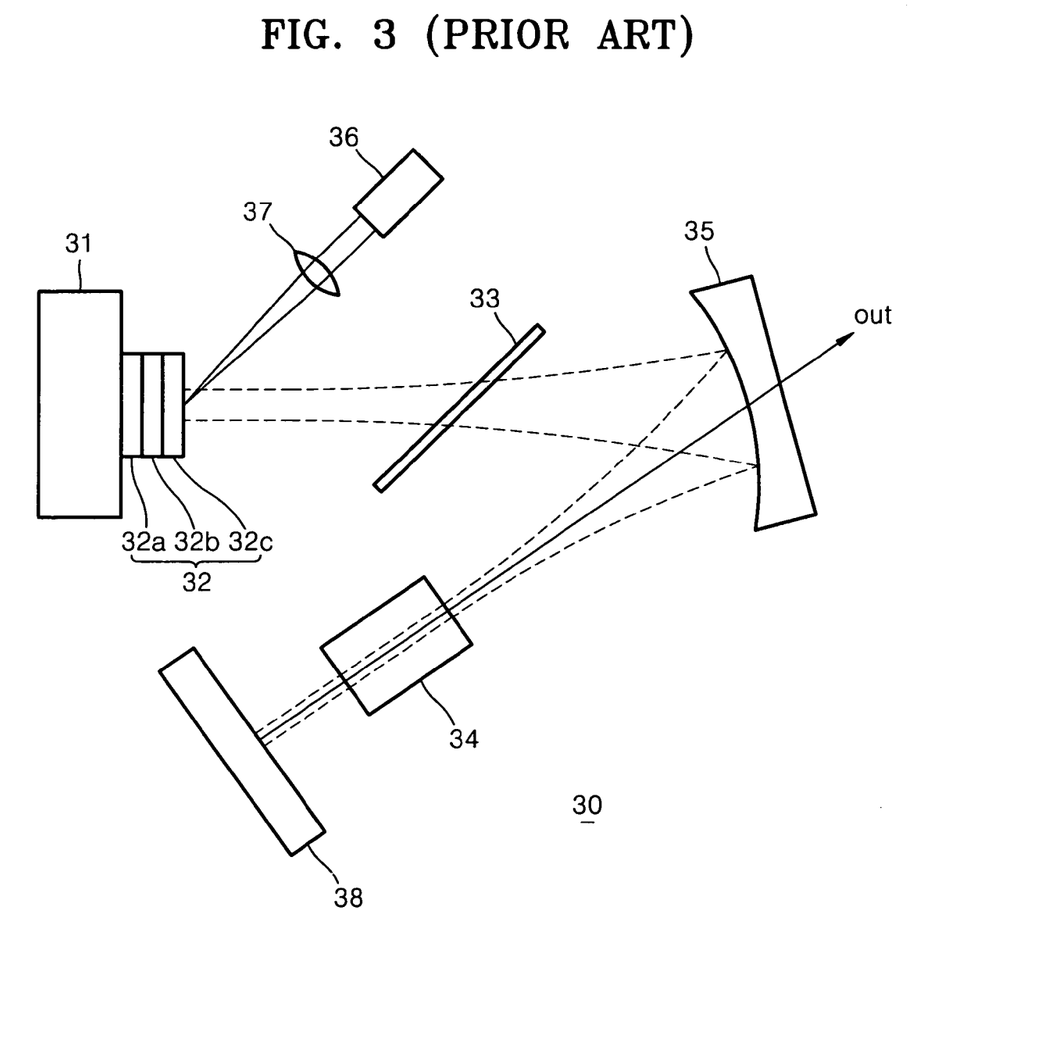
FIG. 3 is a schematic sectional view of a prior VECSEL of a folding structure.

FIG. 3 is a schematic sectional view of a VECSEL 30 of a folding structure to more enhance the efficiency of an SHG crystal. As illustrated in FIG. 3, according to the VECSEL 30 of the folding structure, a light generated from a laser chip 32 passes through a birefringent filter 33, and is obliquely reflected by a concave folding mirror 35 and propagates toward a flat external mirror 38. Therefore, the light resonates between a DBR layer 32b of the laser chip 32 and the external mirror 38, and a cavity is folded by the folding mirror 35. The SHG crystal 34 is located between the folding mirror 35 and the external mirror 38, and a light whose wavelength has been doubled by the SHG crystal 34 is reflected by the external mirror 38 and then outputted to the outside through the folding mirror 35. For that purpose, the surface of the external mirror 38 is coated to have high reflectance with respect to both a light whose frequency has been doubled and a light whose frequency has not been doubled. Also, the folding mirror 35 is coated to have high reflectance with respect to a light whose frequency has not been doubled and have high transmittance with respect to a light whose frequency has been doubled. In FIG. 3, a heat spreader 31, a pump laser 36, and a lens 37 are the same as those described with reference to FIGS. 1 and 2.

In this case, since the cavity is divided into two parts by the folding mirror 35, it is possible to control the beam diameter of a light incident to the laser chip 32 and the beam diameter of a light incident to the SHG crystal 34, respectively. Particularly, it is possible to optimize the wavelength conversion efficiency of the SHG crystal 34 by allowing a light to converge at the position of the SHG crystal 34.

However, in case of the VECSEL illustrated in FIG. 3, not only is one mirror further required but also the mirror should be disposed obliquely with respect to the laser chip, which makes it difficult to align parts. Therefore, the size of an entire laser system also increases. Also, in case of the VECSELs illustrated in FIGS. 1 through 3, the pump laser allowing the laser chip to oscillate is also disposed obliquely with respect to the laser chip, which makes it difficult to align parts and the size of the laser system increases.

SUMMARY OF THE DISCLOSURE

The present disclosure provides a VECSEL of a linear structure, capable of achieving an excellent efficiency of an SHG crystal and being manufactured in a compact size.

The present disclosure provides a VECSEL including: a laser chip emitting a first wavelength light; an external mirror spaced from the laser chip to face the front side of the laser chip; an SHG crystal located between the external mirror and the laser chip to double the frequency of the first wavelength light to make a second wavelength light; a lens element located between the SHG crystal and the laser chip to allow the first wavelength light generated from the laser chip to converge at the SHG crystal; and a wavelength selective mirror located between the SHG crystal and the lens element to transmit the first wavelength light and reflect the second wavelength light to the external mirror.

The wavelength selective mirror may be coated on the surface of the SHG crystal that faces the laser chip.

A coating layer may be formed on the surface of the SHG crystal that faces the external mirror to have an anti-reflection characteristic with respect to both the first wavelength light and the second wavelength light.

A coating layer may be formed on both surfaces of the lens element to have an anti-reflection characteristic with respect to the first wavelength light.

The lens element may be a plane-convex lens having a convex surface facing the laser chip and a flat surface facing the SHG crystal, and the wavelength selective mirror may be coated on the flat surface of the lens element.

A coating layer may be formed on both surfaces of the SHG crystal to have an anti-reflection characteristic with respect to both the first wavelength light and the second wavelength light.

A coating layer may be formed on the convex surface of the lens element to have anti-reflection characteristic with respect to the first wavelength light.

The external mirror may have a concave reflection surface, and a coating layer is formed on the concave reflection surface of the external mirror to reflect the first wavelength light and transmit the second wavelength light, thereby outputting the second wavelength light to the outside.

The VECSEL may further include a birefringent filter located between the laser chip and the lens element to transmit only a predetermined wavelength of light.

The VECSEL may further include a pump laser facing the rear side of the laser chip to provide a third wavelength light for pumping to the rear side of the laser chip.

The laser chip may include a heat spreader having thermal conductivity and light transmittance; a DBR (distributed Bragg reflector) layer located on the surface of the heat spreader to reflect the first wavelength light to the external mirror and transmit the third wavelength light emitted from the pump laser; and an active layer of a quantum well structure, located on the DBR layer and excited by the third wavelength light emitted from the pump laser to generate the first wavelength light.

The laser chip may further include a heat sink enclosing the lateral sides of the heat spreader.

The laser chip may include a heat spreader having thermal conductivity and light transmittance; an active layer of a quantum well structure, located on the lower surface of the heat spreader and excited by the third wavelength light emitted from the pump laser to generate the first wavelength light; and a DBR layer located on the lower surface of the active layer to reflect the first wavelength light to the external mirror and transmit the third wavelength light emitted from the pump laser.

BRIEF DESCRIPTION OF THE DRAWINGS

The above and other features and advantages of the present disclosure will become more apparent by describing in detail exemplary embodiments thereof with reference to the attached drawings in which.

DETAILED DESCRIPTION OF THE DISCLOSURE

Figure 4:
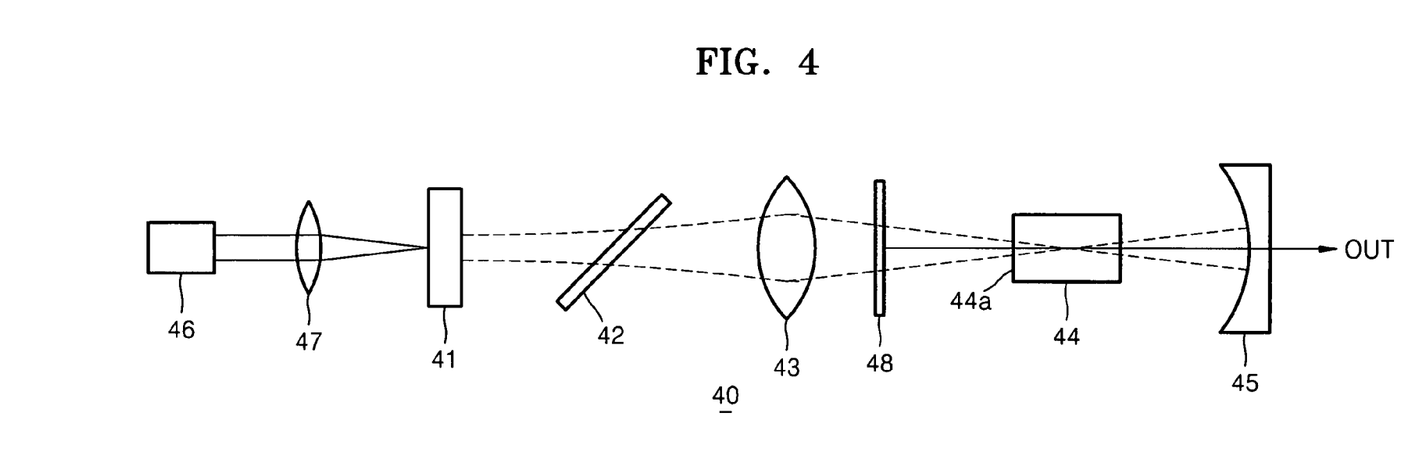
FIG. 4 is a schematic sectional view of a VECSEL of a linear structure according to an embodiment of the present disclosure.

FIG. 4 is a schematic sectional view of a VECSEL of a linear structure according to an embodiment of the present disclosure. Referring to FIG. 4, the VECSEL 40 includes a laser chip 41 emitting a predetermined wavelength light; an external mirror 45 spaced from the laser chip to face the front side of the laser chip 41; an SHG crystal 44 located on an optical path between the external mirror 45 and the laser chip 41 to double the frequency of the predetermined wavelength light; a lens element 43 located on an optical path between the SHG crystal 44 and the laser chip 41; a wavelength selective mirror 48 located on an optical path between the SHG crystal 44 and the lens element 43; and a pump laser 46 facing the rear side of the laser chip 41. Also, a birefringent filter 42 is further located on an optical path between the laser chip 41 and the lens element 43 to transmit only a predetermined wavelength light.

Referring to FIG. 4, the VECSEL 40 is an end pumping type VECSEL where the pump laser 46 is located at the rear side of the laser chip 41. Also, the VECSEL 40 has a linear cavity structure which allows the laser chip 41 to directly face the external mirror 45 without folding the cavity with a folding mirror. Therefore, since the VECSEL 40 includes all of parts aligned on one axis, assembling of the parts is easy and thus the VECSEL 40 may be manufactured in a compact size on the whole.

With this structure, referring to FIG. 4, the convex lens element 43 converging a light is located on an optical path between the SHG crystal 44 and the laser chip 41 in order to independently control the beam diameter of a light incident to the laser chip 41 and the beam diameter of a light incident to the SHG crystal 44. For example, it is possible to control the beam diameter of the light incident to the laser chip 41 from the external mirror 45 to be equal to the size of the oscillation region of the laser chip 41 by appropriately controlling a distance between the lens element 43 and the laser chip 41. Likewise, it is possible to minimize the beam diameter of the light incident to the SHG crystal 44 from the laser chip 41 by appropriately controlling a distance between the lens element 43 and the SHG crystal 44. Also, it is preferable to minimize the beam diameter of the light reflected by the external mirror 45 and incident to the SHG crystal 44 by providing a concave reflection surface of the external mirror 45. According to the present disclosure, it is possible to optimize the oscillation efficiency of the laser chip 41 and the wavelength conversion efficiency of the SHG crystal 44 simultaneously.

The wavelength selective mirror 48 located between the lens element 43 and the SHG crystal 44 transmits a light generated from the laser chip 41 and reflects a light whose frequency has been doubled by the SHG crystal 44 to the external mirror 45. Therefore, the light generated from the laser chip 41 may pass through the wavelength selective mirror 48 and be incident to the SHG crystal 44. Also, a light whose frequency has been doubled among light that have been reflected by the external mirror 45 and passed through the SHG crystal 44, may be reflected by the wavelength selective mirror 48 and return to the external mirror 45, and a light whose frequency has not been doubled may pass through the wavelength selective mirror 48 and be incident to the laser chip 41.

A coating layer may be formed on both surfaces of the lens element 43 to have anti-reflection characteristic with respect to the light whose frequency has not been doubled. Also, a coating layer may be formed on both surfaces of the SHG crystal 44 to have anti-reflection characteristic with respect to both the light whose frequency has been doubled and the light whose frequency has not been doubled. Also, a coating layer is formed on the reflection surface of the external mirror 45 to reflect the light whose frequency has not been doubled and transmit the light whose frequency has been doubled. Therefore, the light whose frequency has been doubled by the SHG crystal 44 may pass through the external mirror 45 and be outputted to the outside, and the light whose frequency has not been doubled may be reflected by the external mirror 45 and incident to the laser chip 41. At this point, a coating layer may be formed on the outer surface of the external mirror 45 to have an anti-reflection characteristic such that a light outputted to the outside is not reflected at the outer surface of the external mirror 45.

In operation, a light for pumping emitted from the pump laser 46 is incident to the laser chip 41 through a lens 47. Then, the active layer within the laser chip 41 is excited to emit a light. The light generated from the laser chip 41 is reflected by the DBR layer within the laser chip 41 to pass through a birefringent filter 42. The light that has passed through the birefringent filter 42 has a very sharp spectrum distribution. After that, the light is converged by the lens element 43 and incident to the SHG crystal 44, which doubles the frequency of part of incident light (that is, converts an incident light into a light whose wavelength has been reduced by half). For example, when a light incident to the SHG crystal 44 is an infrared light, the light that has passed through the SHG crystal 44 is converted into a visible light. The external mirror 45 transmits the light whose frequency has been doubled to output the light to the outside, and reflects the light whose frequency has not been doubled back to the SHG crystal 44. Then, the frequency of part of light is doubled by the SHG crystal 44. The wavelength selective mirror 48 transmits a light whose frequency has not been doubled among the light that have passed through the SHG crystal 44, and reflects a light whose frequency has been doubled. Therefore, the light whose frequency has been doubled is reflected by the wavelength selective mirror 48 and outputted to the outside through the external mirror 45. On the other hand, the light whose frequency has not been doubled is converged by the lens element 43 and incident to the laser chip 41. Part of light incident to the laser chip 41 is absorbed in the active layer within the laser chip 41, and part of light is reflected by the DBR layer within the laser chip 41 to repeat the above-described processes. Through the above processes, the light whose frequency has not been doubled resonates between the laser chip 41 and the external mirror 45.

According to a preferred embodiment of the present disclosure, the wavelength selective mirror 48 may be coated on a surface 44a of the SHG crystal 44 that faces the laser chip 41. By doing so, aligning of parts may be easy compared to the case where the wavelength selective mirror 48 is separately located on an optical path between the lens element 43 and the SHG crystal 44. In this case, however, a light whose frequency has been doubled and propagating toward the laser chip 41 and a light whose frequency has been doubled and reflected by SHG crystal surface 44a may cause destructive interference within the SHG crystal 44, which reduces an output power. To prevent this problem, the thickness of the SHG crystal 44 should be adjusted to be relatively precise.

Figure 5:
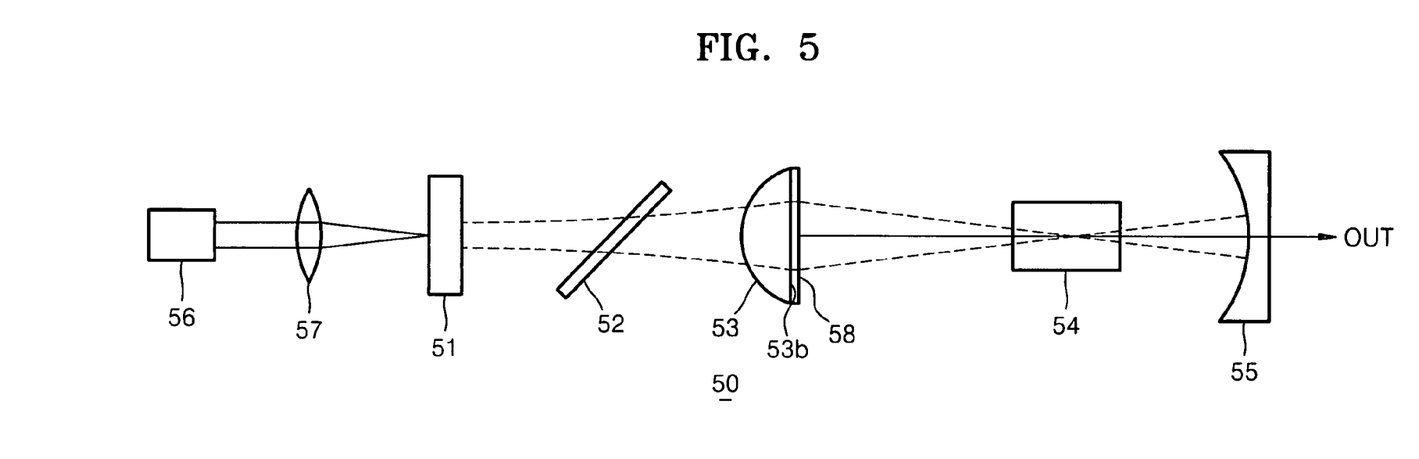
FIG. 5 is a schematic sectional view of a VECSEL of a linear structure according to another embodiment of the present disclosure.

FIG. 5 is a schematic sectional view of a VECSEL 50 of a linear structure according to another embodiment of the present disclosure to solve this inconvenience. According to the embodiment illustrated in FIG. 5, a lens element 53 may be a plane-convex lens having a convex surface facing a laser chip 51 and a flat surface 53b facing an SHG crystal 54. According to the embodiment illustrated in FIG. 5, a wavelength selective mirror 58 is coated on the flat surface 53b of the lens element 53. In this case, a coating layer is formed on only the convex surface of the lens element 53 that faces the laser chip 51 to have an anti-reflection characteristic with respect to a light whose frequency has not been doubled. On the other hand, a coating layer is formed on both surfaces of the SHG crystal 54 to have an anti-reflection characteristic with respect to both a light whose frequency has been doubled and a light whose frequency has not been doubled. When the wavelength selective mirror 58 is formed on the surface 53b of the lens element 53, a path between the wavelength selective mirror 58 and the external mirror 55 becomes relatively long. Therefore, there is small probability that light on two paths whose frequencies have been doubled and propagating in opposite directions, respectively, cause destructive interference. Also, it is much easier to control the distance between the wavelength selective mirror 58 and the external mirror 55 than to precisely adjust the thickness of the SHG crystal 54. Therefore, it is possible to easily satisfy a condition that does not cause destructive interference between the light on two paths whose frequencies have been doubled.

Other elements of the embodiment in FIG. 5, e.g., a pump laser 56, a lens 57, a laser chip 51, a birefringent filter 52, and the external mirror 55 are the same as those described with reference to FIG. 4. That is, other elements except the shape of the lens element 53 and the position of the wavelength selective mirror 58 are the same as those in the embodiment of FIG. 4. Therefore, the operation of the VECSEL according to the embodiment of FIG. 5 is the same as that described with reference to FIG. 4.

Figure 6:
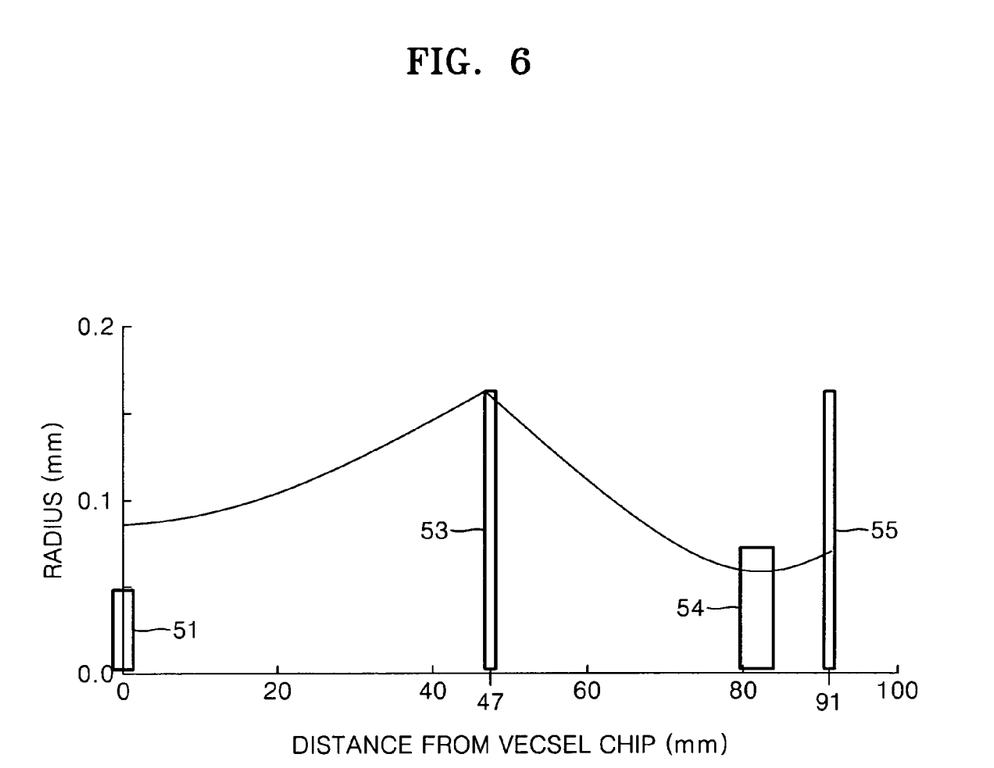
FIG. 6 is a graph illustrating beam radius change in the inside of a cavity of a VECSEL according to the present disclosure.

FIG. 6 is a graph illustrating beam radius change in the inside of a cavity, that is, between the laser chip 51 and the external mirror 55. The graph illustrated in FIG. 6 has been measured for the case where the focal length of the lens element 53 is 25 mm, the curvature radius of the external mirror 55 is 30 mm, a distance between the laser chip 51 and the lens element 53 is 47 mm, a distance between the lens element 53 and the external mirror 55 is 44 mm. As is revealed from FIG. 6, since a light emitted from the laser chip 51 has a little diverging characteristic, the beam diameter of the light gradually increases but converges while passing through the lens element 53, and is minimized at the position of the SHG crystal 54. Therefore, the wavelength conversion efficiency of the SHG crystal 54 may be optimized.

Figure 7:
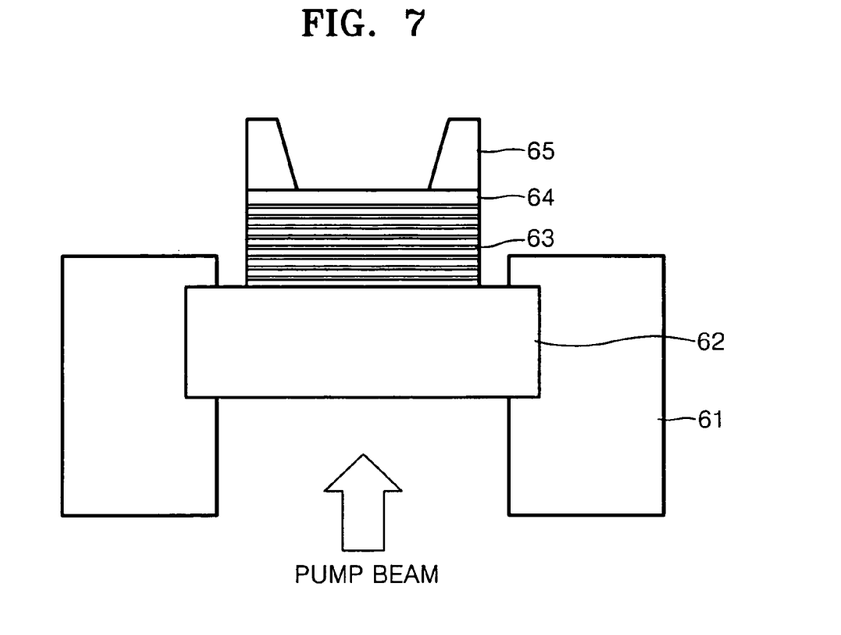
FIGS. 7 and 8 are exemplary views of a laser chip in a VECSEL of a linear structure according to the present disclosure.
Figure 8:
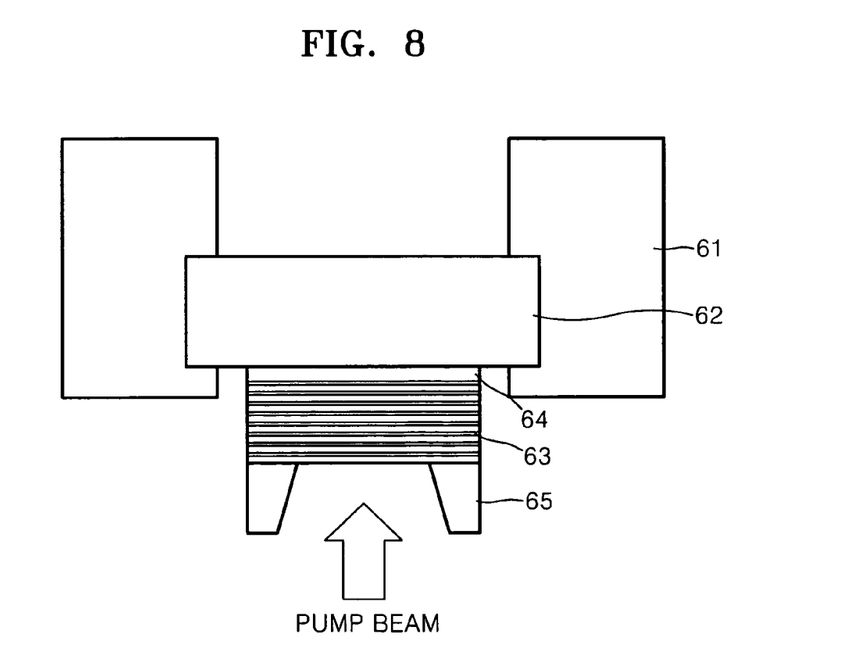

FIGS. 7 and 8 are exemplary sectional views of a laser chip used for a VECSEL of a linear structure according to the present disclosure.

Referring to FIG. 7, the laser chip includes a heat spreader 62 having light transmittance and thermal conductivity, a DBR layer 63 located on the heat spreader 62, an active layer 64 located on the DBR layer 63, and a substrate 65 located on the active layer 64. Also, the laser chip may further include a heat sink 61 enclosing the lateral side of the heat spreader 62.

Here, the laser chip is manufactured by sequentially forming the active layer 64 and the DBR layer 63 on the substrate 65, and bonding the DBR layer 63 on the heat spreader 62. As known in the art, the active layer 64 has a quantum well structure that is excited by a light for pumping emitted from a pump laser to emit a predetermined wavelength light. Also, the DBR layer 63 is a mirror of a multi-layer structure formed to have highest reflectance with respect to a light generated from the active layer 64. Also, the DBR layer 63 is designed to have transmittance with respect to a light for pumping so that the light emitted from the pump laser may be incident to the active layer 64. The substrate 65 may be etched in its central portion in order to reduce light loss as illustrated in FIG. 7.

The heat spreader 62 has excellent thermal conductivity and transfer heat generated from the active layer 64 to the heat sink 61 to cool down the active layer 64. Also, the heat spreader 62 should have light transmittance so that a light emitted from the pump laser may pass through the heat spreader 62 and be incident to the active layer 64. The heat spreader 62 may be formed of diamond, for example. Also, the heat spreader 62 may be formed of a material such as SiC, AlN, and GaN. The heat sink 61 may be formed of a material having excellent thermal conductivity such as Cu. At this point, since the heat sink 61 does not have light transmittance, the heat sink 61 includes an opening in its central portion so that a light for pumping may pass therethrough.

A laser chip illustrated in FIG. 8 is manufactured by sequentially forming a DBR layer 63 and an active layer 64 on a substrate 65, and bonding the upper surface of the active layer 64 on the lower surface of a heat spreader 62. Eventually, the laser chip has a structure in which the active layer 64, the DBR layer 63, and the substrate 65 are sequentially located from the lower surface of the heat spreader 62. Like the laser chip illustrated in FIG. 7, a heat sink 61 is coupled on the later side of the heat spreader 62 of FIG. 8, and the heat sink 61 includes an opening in its central portion so that a light generated form the active layer 64 may pass therethrough.

As described above, the VECSEL according to a preferred embodiment of the present disclosure adopts an end pumping type and has a linear cavity structure. Therefore, since all of the parts are aligned on one axis, assembling of the parts is easy and the VECSEL may be manufactured in a compact size. Also, manufacturing costs and time may reduce compared to the prior art. Furthermore, since the VECSEL of the present disclosure is an end pumping type VECSEL where a light for pumping is incident to the laser chip, it is possible to emit a laser beam almost close to a circular shape.

Also, it is possible to independently control the beam diameter of a light incident to the laser chip and the beam diameter of a light incident to the SHG crystal by arranging the lens element within the cavity. Therefore, it is possible to simultaneously optimize both the oscillation efficiency of the laser chip and the wavelength conversion efficiency of the SHG crystal. Eventually, according to the present disclosure, it is possible to provide a VECSEL having a higher output power than that of the prior art VESCEL.

The present disclosure may be used for manufacturing a VECSEL having a high power for use in a laser television.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A VECSEL (vertical external cavity surface emitting laser) comprising:
    a laser chip emitting a first wavelength light;
    an external mirror spaced from the laser chip to face the front side of the laser chip;
    an SHG (second harmonic generation) crystal located between the external mirror and the laser chip to double the frequency of the first wavelength light to make a second wavelength light;
    a lens element located between the SHG crystal and the laser chip to allow the first wavelength light generated from the laser chip to converge at the SHG crystal; and
    a wavelength selective mirror located between the SHG crystal and the lens element to transmit the first wavelength light and reflect the second wavelength light to the external mirror.

2. The VECSEL of claim 1, wherein the wavelength selective mirror is coated on the surface of the SHG crystal that faces the laser chip.

3. The VECSEL of claim 2, wherein a coating layer is formed on the surface of the SHG crystal that faces the external mirror to have an anti-reflection characteristic with respect to both the first wavelength light and the second wavelength light.

4. The VECSEL of claim 2, wherein a coating layer is formed on both surfaces of the lens element to have an anti-reflection characteristic with respect to the first wavelength light.

5. The VECSEL of claim 2, wherein the external mirror has a concave reflection surface, and a coating layer is formed on the concave reflection surface of the external mirror to reflect the first wavelength light and transmit the second wavelength light, thereby outputting the second wavelength light to the outside.

6. The VECSEL of claim 1, wherein the lens element is a plane-convex lens having a convex surface facing the laser chip and a flat surface facing the SHG crystal, and the wavelength selective mirror is coated on the flat surface of the lens element.

7. The VECSEL of claim 6, wherein a coating layer is formed on both surfaces of the SHG crystal to have an anti-reflection characteristic with respect to both the first wavelength light and the second wavelength light.

8. The VECSEL of claim 6, wherein a coating layer is formed on the convex surface of the lens element to have anti-reflection characteristic with respect to the first wavelength light.

9. The VECSEL of claim 6, wherein the external mirror has a concave reflection surface, and a coating layer is formed on the concave reflection surface of the external mirror to reflect the first wavelength light and transmit the second wavelength light, thereby outputting the second wavelength light to the outside.

10. The VECSEL of claim 1, further comprising a birefringent filter located between the laser chip and the lens element to transmit only a predetermined wavelength of light.

11. The VECSEL of claim 1, further comprising a pump laser facing the rear side of the laser chip to provide a third wavelength light for pumping to the rear side of the laser chip.

12. The VECSEL of claim 11, wherein the laser chip comprises:
a heat spreader having thermal conductivity and light transmittance;
a DBR (distributed Bragg reflector) layer located on the surface of the heat spreader to reflect the first wavelength light to the external mirror and transmit the third wavelength light emitted from the pump laser; and
an active layer of a quantum well structure, located on the DBR layer and excited by the third wavelength light emitted from the pump laser to generate the first wavelength light.

13. The VECSEL of claim 12, wherein the laser chip further comprises a heat sink enclosing the lateral sides of the heat spreader.

14. The VECSEL of claim 11, wherein the laser chip comprises:
a heat spreader having thermal conductivity and light transmittance;
an active layer of a quantum well structure, located on the lower surface of the heat spreader and excited by the third wavelength light emitted from the pump laser to generate the first wavelength light; and
a DBR layer located on the lower surface of the active layer to reflect the first wavelength light to the external mirror and transmit the third wavelength light emitted from the pump laser.

15. The VECSEL of claim 14, wherein the laser chip further comprises a heat sink enclosing the lateral sides of the heat spreader.

* * * * *